United States Patent [19]

Kouzi

[11] Patent Number: 5,101,381
[45] Date of Patent: Mar. 31, 1992

[54] CONTROL CIRCUIT FOR EEPROM

[75] Inventor: Tanagawa Kouzi, Tokyo, Japan

[73] Assignee: Oki Electric Industry Co., Ltd., Tokyo, Japan

[21] Appl. No.: 587,730

[22] Filed: Sep. 25, 1990

Related U.S. Application Data

[60] Continuation of Ser. No. 471,968, Jan. 26, 1990, Pat. No. 4,977,543, which is a division of Ser. No. 238,823, Aug. 31, 1988, Pat. No. 4,907,202.

[30] Foreign Application Priority Data

Aug. 31, 1987 [JP] Japan .................................. 62-215452

[51] Int. Cl.[5] ............................................ G11C 13/00
[52] U.S. Cl. ................................ 365/218; 365/189.01; 365/230.01
[58] Field of Search ............... 365/218, 189.01, 230.01

[56] References Cited

U.S. PATENT DOCUMENTS

| 4,648,076 | 3/1987 | Schrenk | 365/218 |
| 4,805,151 | 2/1989 | Terada et al. | 365/218 |
| 4,907,202 | 3/1990 | Kouzi | 365/218 |
| 4,977,543 | 12/1990 | Kouzi | 365/218 |

Primary Examiner—Terrell W. Fears
Attorney, Agent, or Firm—Wenderoth, Lind & Ponack

[57] ABSTRACT

A control circuit generating a write/erase high voltage pulse for an EEPROM is disclosed. The control circuit comprises a low frequency clock pulse oscillation circuit, a voltage booster circuit having at least 19 FET booster stages and a high voltage shaping switch circuit having an exponential rising pulse edge driven by the clock pulse.

2 Claims, 7 Drawing Sheets

CONTROL CIRCUIT FOR EEPROM

This application is a continuation of allowed application Ser. No. 07/471,968 which is in turn a divisional of application Ser. No. 07/238,823, now U.S. Pat. No. 4,907,202.

BACKGROUND OF THE INVENTION

This invention relates to a control circuit for an EEPROM (Electrically Erasable Programmable Read Only Memory), more particularly to a control circuit generating a high voltage pulse enabling a rewrite function of EEPROM data with low voltage and low power consumption.

There are various kinds of EEPROMs available not only for use as a single unit but for constituting an one-chip microcomputer in combination with a microprocessor, which can be constructed as a CMOS structure.

A semiconductor integrated circuit in which the EEPROM is incorporated has a wide variety of applications such as replacement of a mechanical switch, an IC card having function which stores and adjusts operational procedures of a calculator or stores and refreshes data. (Ex. See NIKKEI ELECTRONICS, Oct. 21, 1985 P. 127).

Since the conventional EEPROM, however, employs a 5 V power supply and needs a data rewrite cycle, it is difficult to be incorporated into the semiconductor integrated circuit utilized in watches, electric calculators, cameras, toys or IC cards driven by a solar cell.

Figure 6:
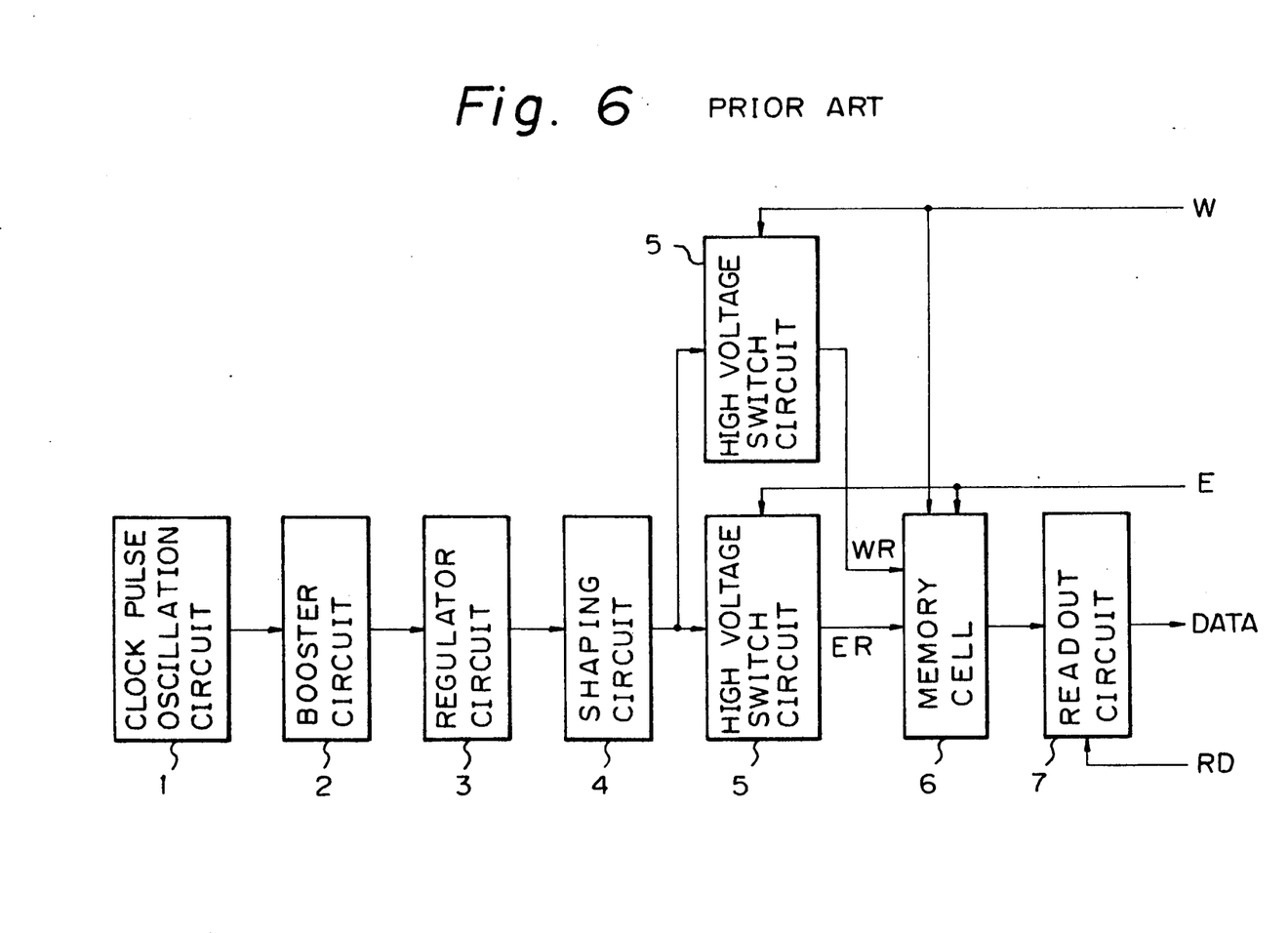
FIG. 6 is a block diagram of a conventional EEPROM.

FIG. 6 shows a block diagram of a control circuit for EEPROM with 5 V single power supply operation generating a high voltage pulse for data write/erase/read.

The power supply voltage of 5 V is applied to a clock pulse generation circuit 1 so that a clock pulse train having a frequency of 5-10 MHz and a peak wave value of 5 V can be achieved.

When the clock pulse is applied to a voltage booster circuit 2, a step-up voltage of 23-25 V can be output.

Figure 7:
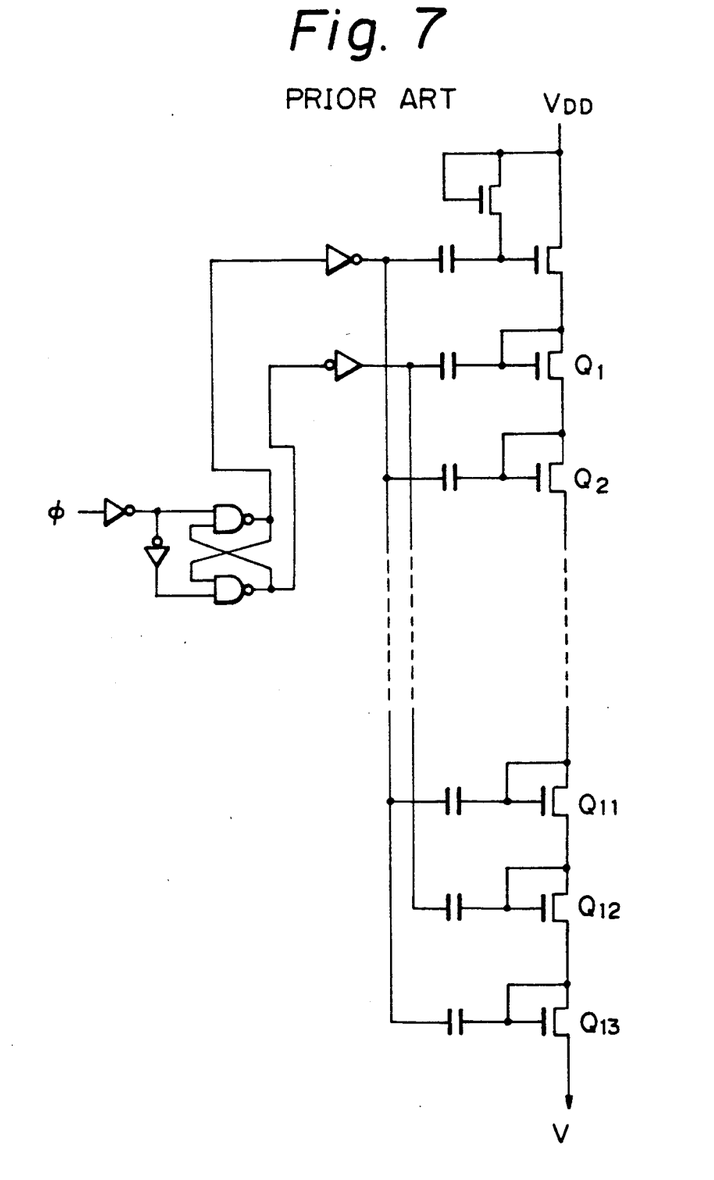
FIG. 7 is a circuit diagram of a conventional booster circuit.

FIG. 7 shows an example of the conventional voltage booster circuit having 10-13 booster stages which are adequate for obtaining a step-up voltage of 20-25 V from a source voltage of 5 V.

The high voltage of 20-25 V generated by the booster circuit 2 is applied to a regulator circuit 3 which stabilizes the high voltage to a constant level voltage.

Figure 8A:
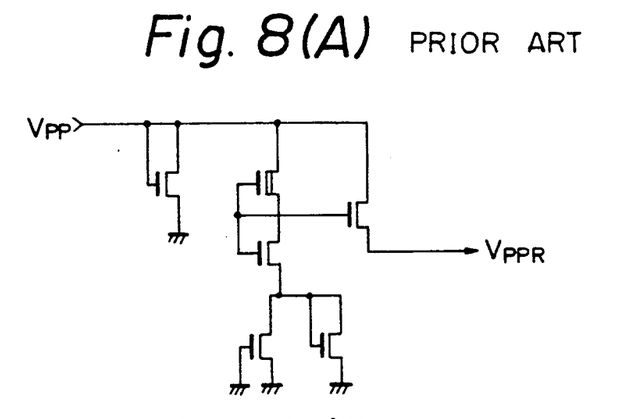
FIG. 8(A), FIG. 8(B) and FIG. 8(C) are circuit diagrams of a conventional regulator circuit, a shaping circuit and a high voltage switch circuit, respectively.

FIG. 8(A) shows a concrete circuit of the regulator circuit, the output voltage of which is 18-20 V in direct current (D.C.).

A wave shaping circuit 4 generates a high voltage pulse which is necessary to write/erase data of cells of the EEPROM.

The high voltage pulse requires a peak wave value of 18-20V and a constant rising rate, for example, 16 V/ms.

When the rising rate is too sharp, the reliability of the cells of the EEPROM will be deteriorated.

Figure 8B:
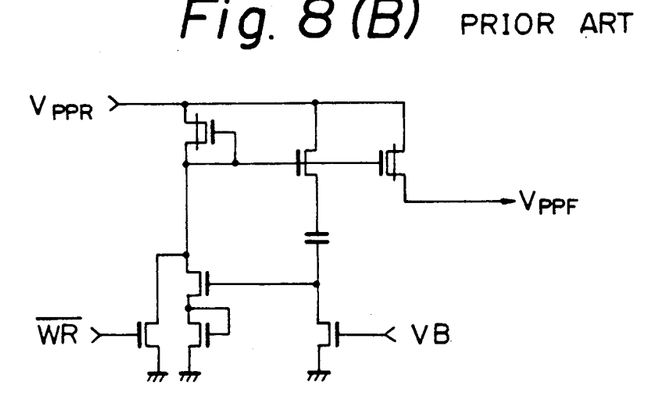

One embodiment of the concrete wave shaping circuit is shown in FIG. 8(B).

There is provided a high voltage switch circuit 5 to switch the high voltage pulse generated by the wave shaping circuit 4 to a writing direction or to an erasing direction, interchangeably.

Figure 8C:
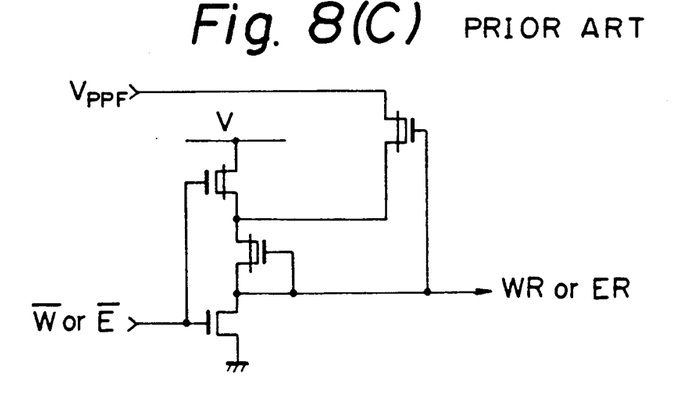

FIG. 8(C) shows a concrete circuit of the high voltage switch circuit 5.

The high voltage pulse is switched interchangeably by the high voltage switch circuit 5 such a manner that the high voltage pulse is applied to a drain electrode of the memory cell in accordance with a writing signal W in case of writing, whereas it is applied to a gate electrode of the memory cell in accordance with an erasing signal E on erasing.

A memory cell 6 is constituted by being arrayed a plurality of FETs with a double layer silicon gate structure comprising a source electrode, a drain electrode, a floating gate and a gate electrode.

Figure 9:
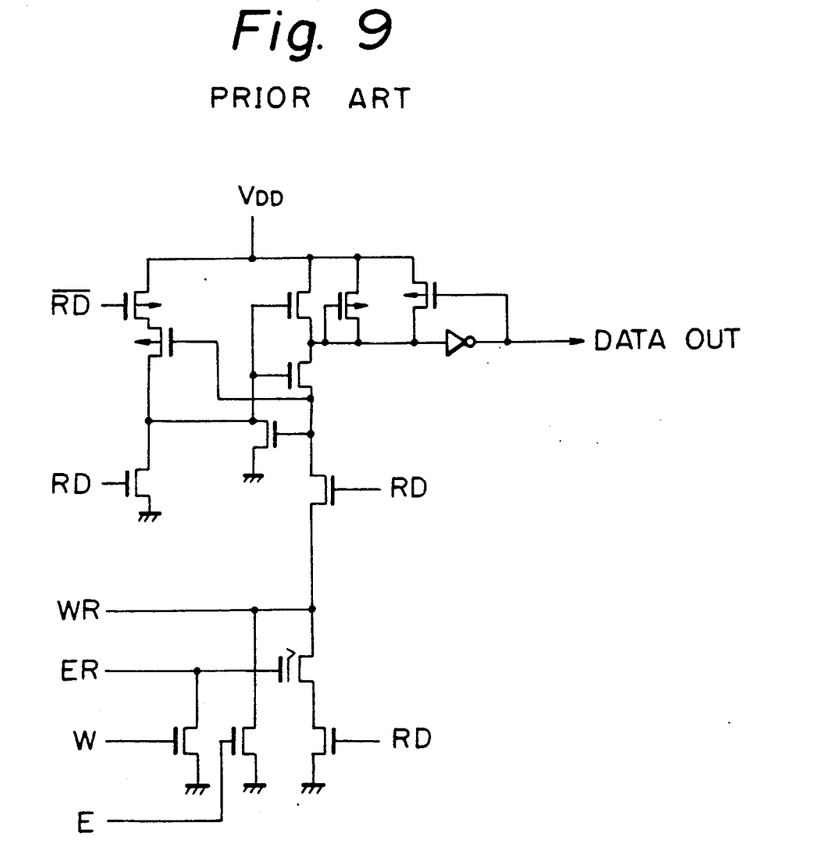
FIG. 9 is a circuit diagram of a conventional memory cell and a read-out circuit thereof.

One embodiment of the concrete circuit is shown in FIG. 9.

The writing function to the memory cell 6 is performed such that the high voltage pulse is applied between the drain and the gate with the gate electrode being fixed to zero volt.

The erasing cycle is performed such that the high voltage pulse is applied between the gate and the drain with the drain electrode being fixed to zero volt.

SUMMARY OF THE INVENTION

An object of the present invention is to provide a control circuit for an EEPROM which enables writing and erasing data to the EEPROM with low voltage of an approximate 1.5 V and low current less than a few hundred uA.

To accomplish the above object, there is provided a control circuit generating a write/erase high voltage pulse for an EEPROM which comprises a low frequency clock pulse oscillation circuit, a voltage booster circuit having at least 19 FET booster stages and a high voltage shaping switch circuit having an exponential rising pulse edge driven by the clock pulse.

According to the invention, a low current consumption can be achieved by driving the control circuit by the low frequency clock pulse of an approximate 30 KHz, and a high voltage necessary for writing to the EEPROM can be achieved from a low voltage with high conversion efficiency by employing the voltage booster circuit having at least 19 FET booster stages.

Further, the high voltage switch circuit having an exponential rising pulse edge requires no special wave shaping circuit so that a simplified and low voltage operated circuit can be achieved.

DETAILED DESCRIPTION OF THE EMBODIMENT

Figure 1:
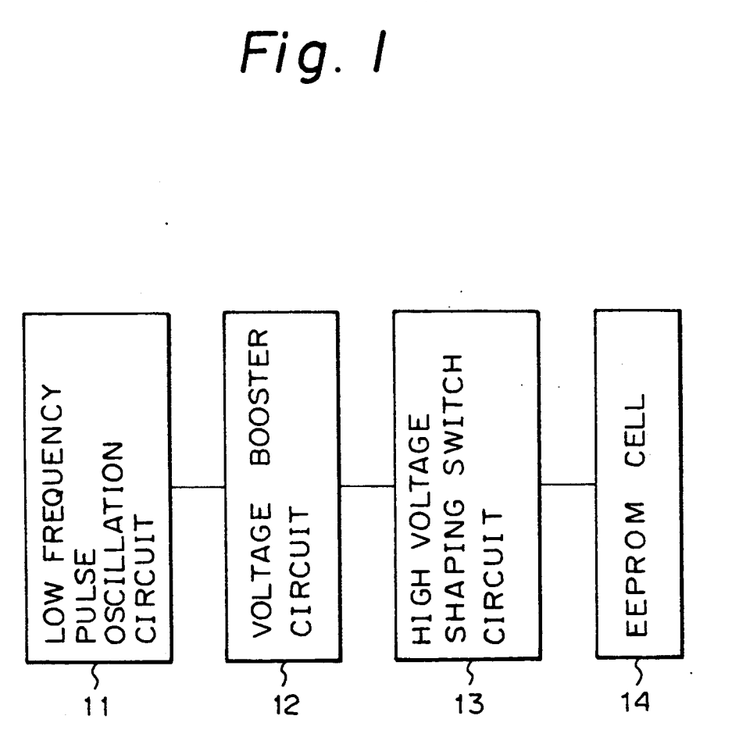
FIG. 1 is a block diagram of a control circuit for an EEPROM illustrating one embodiment according to the present invention.

Referring to FIG. 1, the control circuit for the EEPROM according to the present invention comprises a low frequency pulse oscillation circuit 11, a voltage booster circuit 12, and a high voltage shaping switch circuit 13.

The low frequency clock pulse oscillation circuit 11 is an oscillator generating an approximate 30 KH$_Z$ frequency driven by low voltage and low current.

It is essential to lower the frequency of the clock pulse for reducing power consumption of the whole control circuit.

The adequate frequency range for the clock pulse lies between 20 KH$_z$ and 100 KH$_Z$. The present embodiment shows an oscillator operating with a 1.5 V source voltage and a few uA consumption current.

The voltage booster circuit 12 is a booster circuit with low power consumption which operates with low power source driven by the oscillajtion circuit 11.

Though a conventional booster circuit has approximately 10 stages, the present invention employs at least 19 stages, particularly in the present embodiment 24 stages, to operate with low power voltage of an approximate 1.5 V.

Figure 2:
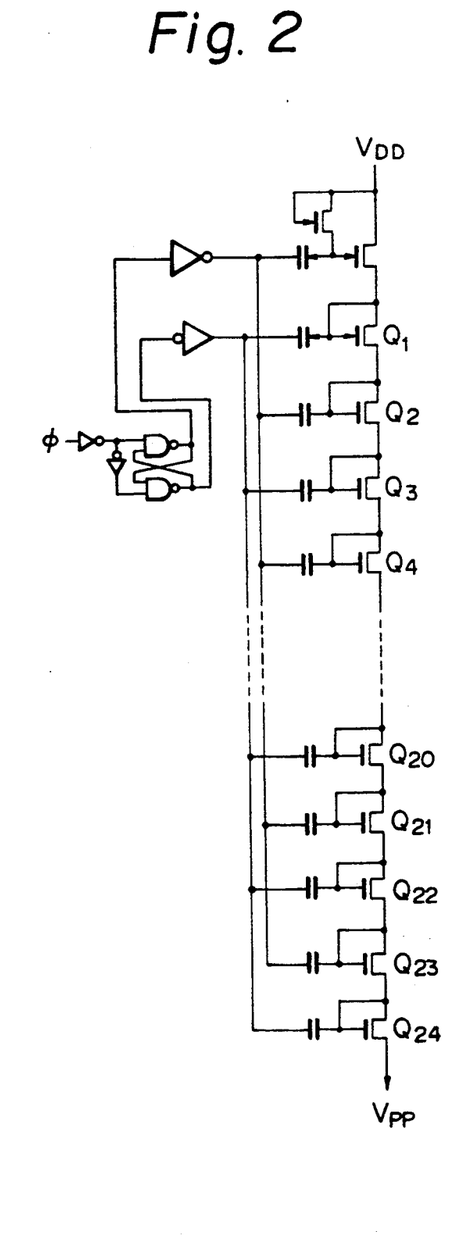
FIG. 2 is a circuit diagram of a booster circuit utilized in one embodiment of the invention.

FIG. 2 shows a circuit diagram of the voltage booster circuit in accordance with the present embodiment.

Transistors Q1-Q24 constitute the booster stages, each of which is constituted by zero threshold FETs.

The zero threshold FET is an FET where the threshold voltage is controlled to be nearly zero volt (approximately 0±0.4 V).

Utilization of the zero threshold voltage FET in the booster stage enables to elevate voltage efficiently without voltage loss.

In this embodiment, an approximate 20 V high voltage necessary for writing and erasing of the EEPROM can be obtained as an output voltage V$_{pp}$ about 20 ms later after the clock is supplied under conditions of the power source voltage V$_{DD}$ being 1.5 V, the booster stage being 24 and the clock frequency being 30 KH$_Z$.

In this voltage booster circuit, as long as a clock is applied thereto, the output voltage V$_{pp}$ of about 24 V in D. C. can be obtained.

The voltage booster circuit according to the present invention employs at least 19 stage zero threshold FETs and is driven by the low voltage power source V$_{DD}$ having an approximate 1.5 V and the slow clock having an approximate 30 KH$_Z$ so that the output voltage V$_{PP}$ having an approximate 20 V which is adequete for writing and erasing of the cell of the EEPROM can be obtained.

Accordingly, a regulator circuit which is used in the conventional circuit is not necessarily require because the voltage booster circuit has the same function.

The high voltage shaping switch circuit 13 is a circuit which forms a high voltage pulse needed for data writing and erasing of the memory cell 14 by using the approximate 20 V achieved by the booster circuit 12.

Figure 3:
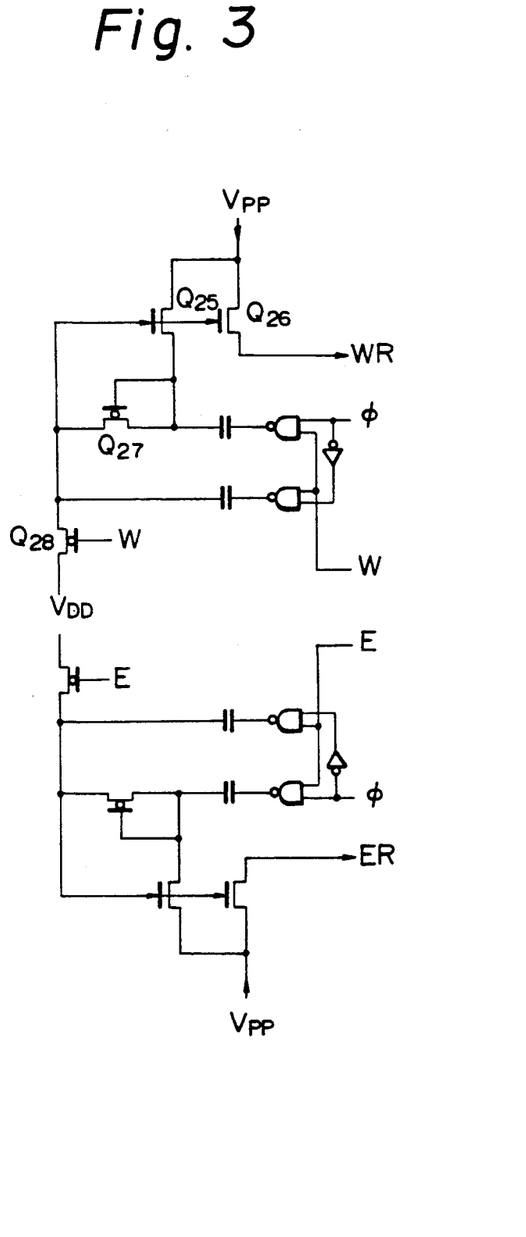
FIG. 3 is a circuit diagram of a high voltage shaping switch circuit utilized in one embodiment of the invention.

FIG. 3 shows an embodiment of the circuit.

When a writing signal W is to be "1", a high voltage WR for writing can be formed from the D. C. voltage V$_{PP}$ by the functions of transistors Q$_{25}$, Q$_{26}$ and Q$_{27}$ and two capacitors.

This high voltage pulse is of an exponential type which has a 1-5 ms rising edge due to the function of transistor and capacitor of 1-2 pF when driven by the clock pulse of an approximate 30 KH$_Z$.

Figure 5:
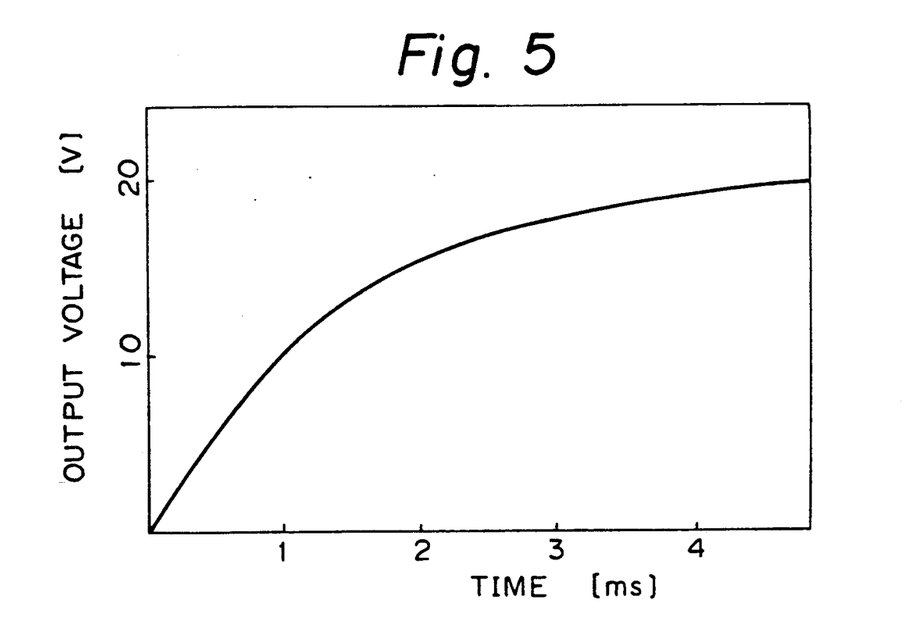
FIG. 5 is a wave form chart of a high voltage pulse showing a rising edge of the pulse according to the invention.

FIG. 5 shows a wave form chart illustrating the rising edge of the pulse.

The exponential type pulse is particularly suitable with an approximate 1 ms rising edge.

The memory cell 14 itself is the same type as the conventional one arrayed by FETs for data storage having source-drain electrodes, a floating gate and a normal gate.

Figure 4:
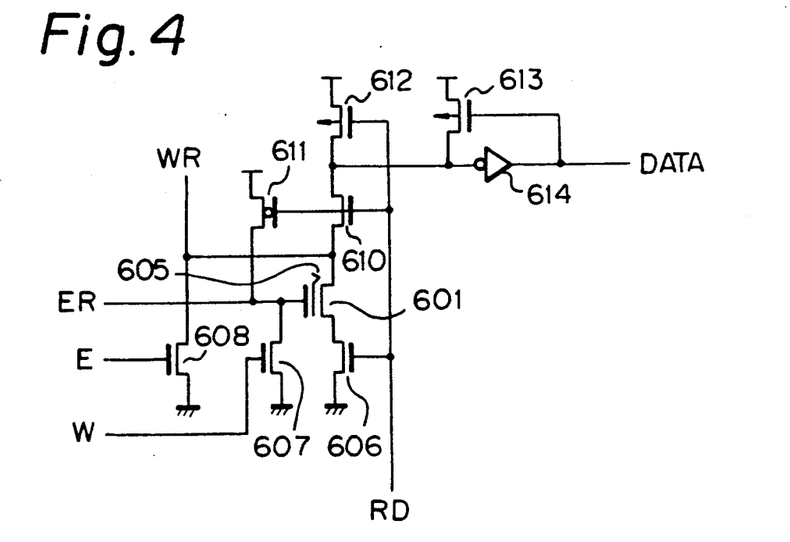
FIG. 4 is a circuit diagram of a memory cell and a read-out circuit thereof utilized in one embodiment of the invention.

Now, the writing and the erasing functions will be explained referring to FIG. 4.

In case of writing, after the switch circuit is activated by the writing signal W being "1", the high voltage pulse is applied to the drain of the memory cell FET 601 and the gate of the FET 601 is simultaneously grounded to zero by the transistor 607.

Then, electrons stored in the floating gate 605 are transferred through the drain so that positive electric charges are accumulated in the floating gate.

In case of erasing, after the switch circuit is activated by the erasing signal E being "1", the high voltage pulse is applied to the gate of the memory cell FET 601 and the gate of the FET 601 is simultaneously grounded to zero by the transistor 608.

Then, electrons are injected to the floating gate causing negative charging up.

In other words, the positive electric charges injected in writing cycle are erased and further negative charges are accumulated.

Now, data read-out operation will be explained.

First, a read-out signal RD is set to be "1".

Then, an approximate 1.3 V read-out voltage is applied through the zero threshold FET 611 to the gate of the memory cell FET.

In the event that the memory cell is being written, namely the floating gate is being positively charged, the memory cell FET 601 becomes conductive between the source and the drain so that the drain current flows through the FETs 610, 601 and 606.

Then, an inverter 614 and an FET 613 read out date "1".

In the event that the memory cell is being erased, namely, the floating gate is being negatively charged, the memory cell FET 601 does not become conductive so that the drain current does not flow through the FETs 610, 601 and 606.

Then, the inverter 614 and the FET 613 read out date "0".

What is claimed is:

1. A control circuit for generating a write/erase high voltage pulse for an EEPROM including a pulse oscillation circuit and a voltage booster circuit having a plurality of booster stages each of which has a FET being driven by a clock pulse, wherein the clock pulse oscillation circuit generates a low frequency clock pulse and the control circuit comprises:

a high voltage shaping switch circuit having a first NAND gate having a first input terminal for receiving the clock pulse, a second input terminal for receiving a writing/erasing signal and an output terminal;

a second NAND gate having a first input terminal for receiving a pulse corresponding to an inverted clock pulse; a second input terminal for receiving the writing/erasing signal and an output terminal;

a first transistor having a first terminal connected to an output terminal of the voltage booster circuit, a second terminal and a control terminal connected to a node;

a second transistor having a first terminal connected to the output terminal of the voltage booster circuit, a second terminal for supplying a write/erase high voltage pulse and a control terminal connected to said node;

a third transistor having a first terminal connected to said node, a second terminal connected to said second terminal of said first transistor and a control terminal connected to said second terminal of said second transistor;

a first capacitor connected between said output terminal of said first NAND gate and said second terminal of said second transistor and a second capacitor connected between said output terminal of said second NAND gate and said low voltage power source.

2. A control circuit according to claim 1, wherein said high voltage shaping switch circuit further comprises a fourth transistor connected between said low voltage power source and said node, said fourth transistor having a control terminal for receiving said writing/erasing signal.

* * * * *

UNITED STATES PATENT AND TRADEMARK OFFICE
CERTIFICATE OF CORRECTION

PATENT NO. : 5,101,381
DATED : March 31, 1992
INVENTOR(S) : Kouzi TANAGAWA It is certified that error appears in the above-identified patent and that said Letters Patent is hereby corrected as shown below:

On the title page:[75], change "Tanagawa Kouzi" to --Kouzi Tanagawa--.

Signed and Sealed this

First Day of June, 1993

Attest:

MICHAEL K. KIRK

*Attesting Officer*  Acting Commissioner of Patents and Trademarks